US006350560B1

(12) United States Patent
 Sahbari

(10) Patent No.: US 6,350,560 B1
(45) Date of Patent: Feb. 26, 2002

(54) RINSE COMPOSITION

(75) Inventor: Javad J. Sahbari, Sunnyvale, CA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/633,539

(22) Filed: Aug. 7, 2000

(51) Int. Cl.⁷ .................................................. G03F 7/40
(52) U.S. Cl. ........................................ 430/325; 134/1.3
(58) Field of Search ............................ 430/325; 134/1.3

(56) References Cited

U.S. PATENT DOCUMENTS

| | | | |
|---|---|---|---|
| 4,202,703 A | 5/1980 | Zuber et al. ................... 134/2 |
| 4,239,661 A | * 12/1980 | Muraoka et al. ............. 430/331 |
| 4,397,938 A | * 8/1983 | Desai et al. ................. 430/296 |
| 4,649,099 A | * 3/1987 | Oguchi ....................... 430/323 |
| 4,701,390 A | 10/1987 | Grunwald et al. .......... 430/325 |
| 4,786,578 A | 11/1988 | Neisius et al. .............. 430/256 |
| 4,824,762 A | 4/1989 | Kobayashi et al. ......... 430/258 |
| 5,571,447 A | * 11/1996 | Ward et al. .................. 510/206 |
| 5,597,678 A | 1/1997 | Honda et al. ............... 430/331 |
| 5,962,197 A | 10/1999 | Chen et al. ................. 430/331 |
| 5,968,848 A | * 10/1999 | Tanabe et al. ................. 134/2 |
| 6,068,000 A | * 5/2000 | Tanabe et al. .............. 134/1.3 |

FOREIGN PATENT DOCUMENTS

| | | |
|---|---|---|
| EP | 0 851 305 A1 | 7/1998 |
| WO | WO 88/05813 | 8/1988 |

* cited by examiner

*Primary Examiner*—Hoa Van Le
(74) *Attorney, Agent, or Firm*—S. Matthew Cairns

(57) ABSTRACT

Disclosed are compositions and methods useful for the removing polymer stripping compositions from substrates without formations of undesirable precipitate in the rinse solution. The compositions of the present invention are particularly suitable for removing residues of stripping compositions used to remove polymer residues from plasma etch processes.

10 Claims, No Drawings

RINSE COMPOSITION

BACKGROUND OF THE INVENTION

The present invention relates generally to the field of removal of polymeric materials from a substrate. In particular, the present invention relates to compositions and methods as rinse compositions for polymer removers.

Numerous materials containing polymers are used in the manufacture of electronic devices, such as circuits, disk drives, storage media devices and the like. Such polymeric materials are found in photoresists, solder masks, antireflective coatings, and the like. For example, modern technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all unexposed areas so as to permit further lithographic operations. Even the partial remains of a resist in an area to be further patterned is undesirable. Also, undesired residue between patterned features can have deleterious effects on subsequent film depositions processes, such as metallization, or cause undesirable surface states and charges leading to reduced device performance.

The semiconductor industry is moving toward sub-quarter micron geometry features. As the geometry of the features gets smaller and pattern density increases, plasma etching, reactive ion etching, ion milling and the like are required for the lithographic process. During such plasma etching, reactive ion etching and ion milling processes, the polymeric material is subjected to conditions that make the removal of such polymeric material difficult. During the plasma etch process a photoresist film forms a hard to remove organometallic polymeric residue on the sidewalls of the various features being etched. Furthermore, the photoresist is extensively cross-linked due to the high vacuum and high temperature conditions in the etch chamber.

The difficulty of removing post plasma etch polymers depends upon the plasma etch gas used. For example, when chlorine-type gas is used, such as $BCl_3$ or $Cl_2$, the resulting organometallic polymer can be removed by conventional strippers. However, when fluorine-type etch gas is used, such as $CF_4$ or CHF3, then the resulting organometallic polymer is fluorinated and the conventional strippers do not sufficiently remove such residue. Fluorine containing strippers are typically used to remove such fluorinated organometallic polymer residue.

Numerous polymer stripper compositions have been developed to remove photoresists, antireflective coatings and post plasma etch polymeric residue. One class of such removers is based on fluoride, such as hydrofluoric acid, ammonium fluoride or ammonium bifluoride. For example, U.S. Pat. No. 5,320,709 (Bowden et al.) discloses compositions for the selective removal of organometallic residues remaining after plasma etching of materials including anhydrous ammonium fluoride salt selected from anhydrous ammonium fluoride or anhydrous ammonium bifluoride in a polyhydric alcohol, wherein the composition contains less than 4% by weight added water. Such fluoride based stripping compositions are particularly suitable for use in the removal of post plasma etch polymeric residue.

In general, after a substrate has been treated with a stripping composition, it is rinsed, typically with water or isopropanol. Isopropanol is generally preferred as it removes any residue from the stripping compositions, such as water and organic components, and dries quickly. Also, many of the metals used in the manufacture of electronic devices are sensitive to corrosion, such as by water. Thus, it is desirable to limit the contact of such metal layers with large amounts of water. Such isopropanol rinses are effective in removing fluoride-based stripping composition residues, however, such rinses form precipitate. Precipitate formation creates problems in subsequent processing steps by clogging the fine features in the electronic devices itself. Such precipitant formation may also clog tubes or filters used in filtering such rinse solutions prior to disposal of such rinses.

Methods for increasing the effectiveness of polymer removers have been proposed. For example, U.S. Pat. No. 4,786,578 (Neisius et al.) discloses a rinse solution used after a photoresist stripper. This rinse solution contains a nonionic surfactant and an organic base, such as an alkanolamine, that will form a water-soluble salt with alkylbenzenesulfonic acids. U.S. Pat. No. 4,824,762 (Kobayashi et al.) discloses a photoresist stripper post rinse containing a glycol ether and an aliphatic amine. In both patents, the compositions contain amines which tend to cause corrosion of copper present in the electronic devices. Further, these compositions will not avoid the precipitate problem when used to rinse fluoride-based stripping compositions.

There is thus a continuing need to effectively remove stripping composition residue from electronic devices in ways that are environmentally compatible, that do not damage the features and geometries of the electronic devices, that do not cause corrosion of the substrate, particularly thin metal films, that do not etch dielectric layers in the substrate, and that do not form precipitate when removing fluoride-based stripping composition residues.

SUMMARY OF THE INVENTION

It has been surprisingly found that stripping composition residues may be effectively and easily removed from a substrate, such as an electronic device, without the formation of a precipitate by rinsing the electronic device with a composition of the present invention.

In one aspect, the present invention provides a composition including water and two or more solvents, wherein at least one solvent is selected from polyol compounds or glycol ethers.

In a second aspect, the present invention provides a method of removing stripping composition residue from a substrate including the step of contacting the substrate with a composition described above.

In a third aspect, the present invention provides a method for manufacturing an electronic device including: a) contacting polymeric material disposed on a substrate with a stripping composition for a period of time sufficient to at least partially remove the polymeric material; and b) then contacting the substrate with a composition including water and two or more solvents, wherein at least one solvent is selected from polyol compounds or glycol ethers.

DETAILED DESCRIPTION OF THE INVENTION

As used throughout this specification, the following abbreviations shall have the following meanings unless the context clearly indicates otherwise: ° C.=degrees Centigrade; % wt=percent by weight; mL=milliliter; DI=deionized; DPM=dipropylene glycol monomethyl ether; and PME=propylene glycol monomethyl ether. All percentages and ratios are by weight, unless otherwise indicated. All numerical ranges are inclusive and combinable.

The terms "stripping" and "removing" are used interchangeably throughout this specification. Likewise, the terms "stripper" and "remover" are used interchangeably. "Alkyl" refers to linear, branched and cyclic alkyl. The term "substituted alkyl" refers to an alkyl group having one or more of its hydrogens replaced with another substituent group, such as halogen, cyano, nitro, $(C_1-C_6)$alkoxy, mercapto, $(C_1-C_6)$alkylthio, and the like. The term "glycol" refers to dihydric alcohols. Thus, the term "glycol ether" refers to ethers of dihydric alcohols.

The compositions of the present invention include water and two or more solvents, wherein at least one solvent is selected from polyol compounds or glycol ethers. The polyol compounds useful in the present invention are any which are miscible with water. By the term "polyol compound" is meant a compound having two or more hydroxyl groups. Suitable polyol compounds include aliphatic polyol compounds such as $(C_2-C_{20})$alkanediols, substituted $(C_2-C_{20})$alkanediols, $(C_2-C_{20})$alkanetriols, substituted $(C_2-C_{20})$alkanetriols, and the like. Suitable aliphatic polyol compounds include, but are not limited to, ethylene glycol, propylene glycol, diethylene glycol, dipropylene glycol, triethylene glycol, tripropylene glycol, 2-methyl-1,3-propanediol, butanediol, pentanediol, hexanediol, glycerol and the like. It is preferred that the aliphatic polyol compound is ethylene glycol, propylene glycol, 2-methyl-propanediol, butanediol or pentanediol. Such polyol compounds are generally commercially available, such as from Aldrich (Milwaukee, Wis.), and may be used without further purification.

Any water soluble glycol ether may be used in the present invention. Typical glycol ethers include $(C_1-C_6)$alkyl ethers of $(C_2-C_{20})$alkanediols, di$(C_1-C_6)$alkyl ethers of $(C_2-C_{20})$alkanediols, $(C_1-C_6)$alkyl ethers of $(C_2-C_{20})$alkanetriols or di$(C_1-C_6)$alkyl ethers of $(C_2-C_{20})$alkanetriols. Suitable glycol ethers include, but are not limited to, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether or tripropylene glycol monomethyl ether. The glycol ethers useful in the present invention are generally commercially available and may be used without further purification.

It is preferred that the two or more solvents are selected from $(C_2-C_{20})$alkanediols, substituted $(C_2-C_{20})$alkanediols, $(C_2-C_{20})$alkanetriols, substituted $(C_2-C_{20})$alkanetriols, $(C_1-C_6)$alkyl ethers of $(C_2-C_{20})$alkanediols, di$(C_1-C_6)$alkyl ethers of $(C_2-C_{20})$alkanediols, $(C_1-C_6)$alkyl ethers of $(C_2-C_{20})$alkanetriols or di$(C_1-C_6)$alkyl ethers of $(C_2-C_{20})$alkanetriols. It is further preferred that two or more solvents are selected from glycol ethers. It is still further preferred that two or more solvents are selected from ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether or tripropylene glycol monomethyl ether. It is still further preferred that the present compositions include water and two solvents, both of which are selected from glycol ethers.

The two or more solvents may be used in any ratio. For example, when two solvents are used, the ratio of the first solvent to the second solvent may be from about 99:1 to 1:99, preferably from about 80:20 to about 20:80.

Typically, the two or more solvents are used in the present compositions at a wide range of amounts, such as from about 1 to about 75% wt, based on the total weight of the composition. It is preferred that the two or more solvents are from about 25 to about 70% wt, and more preferably from about 35 to about 60% wt.

A wide range of amounts of water may be used in the present invention. Typically, water is used at an amount of from about 25 to about 99% wt, based on the total weight of the composition. It is preferred that water is used at >25% wt, based on the total weight of the composition, more preferably >30% wt, still more preferably >40% wt, and even more preferably >50% wt. A particularly useful range of amounts of water is from about 30 to about 70% wt, and more particularly from about 40 to about 65% wt. It is preferred that the water is deionized. The water and two or more solvents may be combined in any order.

In general, polymeric material is removed from a substrate, such as an electronic device, by first contacting the polymeric material with a stripping composition. Stripping composition residue is removed from the substrate by contacting the substrate with a rinsing composition including water and two or more solvents, wherein at least one solvent is selected from $(C_2-C_{20})$alkanediols, $(C_2-C_{20})$alkanetriols, $(C_1-C_6)$alkyl ethers of $(C_2-C_{20})$alkanediols, di$(C_1-C_6)$ ethers of $(C_2-C_{20})$alkanediols, $(C_1-C_6)$alkyl ethers of $(C_2-C_{20})$alkanetriols or di$(C_1-C_6)$alkyl ethers of $(C_2-C_{20})$alkanetriols. The substrate may be contacted with the present rinsing compositions by a any of a variety of means, such as by spraying, dipping and the like.

The rinsing compositions of the present invention may be effectively used at a wide range of temperatures, such as but not limited to, up to about 60° C., preferably from about 20° C. to about 50° C., more preferably from about 23° C. to about 45° C., and most preferably from about 25° C. to about 35° C. An advantage of the rinsing compositions is that they may be effectively used at ambient temperature.

Once the substrate is rinsed with the present compositions, the substrate may optionally be dried prior to subsequent processing steps. Drying may be by any means, such as heat, spin drying or by passing a gas stream over the substrate, such as a nitrogen stream.

The compositions of the present invention are particularly useful for removing fluoride-based stripper residue from a substrate, particularly an electronic device. Suitable electronic devices include, but are not limited to, wafers used in the manufacture of integrated circuits, but may also include any electronic device where polymeric material is removed. By "fluoride-based stripper" is meant any stripping composition containing fluoride ion, such as hydrofluoric acid based strippers, ammonium fluoride based strippers, tetraalkylammonium fluoride based strippers and ammonium bifluoride based strippers. Precipitate formation in the rinse solution is greatly reduced, substantially eliminated or completely avoided by using the present invention to rinse a substrate that has been cleaned with a fluoride-based stripper. It is preferred that the rinsing compositions of the present invention, when used to remove stripping residue, are substantially free of precipitate formation.

Thus, the present invention provides a method for manufacturing an electronic device comprising: a) contacting polymeric material disposed on a substrate with a stripping composition for a period of time sufficient to at least partially remove the polymeric material; and b) then contacting the substrate with a rinsing composition including water and two or more solvents, wherein at least one solvent is selected from $(C_2-C_{20})$alkanediols, $(C_2-C_{20})$alkanetriols, $(C_1-C_6)$alkyl ethers of $(C_2-C_{20})$alkanediols, di$(C_1-C_6)$alkyl ethers of $(C_2-C_{20})$alkanediols, $(C_1-C_6)$alkyl ethers of $(C_2-C_{20})$alkanetriols or di$(C_1-C_6)$alkyl ethers of $(C_2-C_{20})$ alkanetriols.

The rinsing compositions of the present invention may optionally include one or more additives. Suitable additives include, but are not limited to, corrosion inhibitors, wetting agents, co-solvents, chelating agents and the like. However, such optional components are not necessary. It is preferred that the compositions of the present invention are free of optional components.

Any corrosion inhibitor which reduces the corrosion of metal film layers is suitable for use in the present invention. Suitable corrosion inhibitors include, but are not limited to, catechol; $(C_1-C_6)$alkylcatechol such as methylcatechol, ethylcatechol and tert-butylcatechol; benzotriazole; hydroxyanisole; $(C_1-C_{10})$alkylbenzotriazoles; $(C_1-C_{10})$ hydroxyalkylbenzotriazoles; 2-mercaptobenimidazole; gallic acid; gallic acid esters such as methyl gallate and propyl gallate; and the like. It is preferred that the corrosion inhibitor is catechol, $(C_1-C_6)$alkylcatechol, benzotriazole or $(C_1-C_{10})$alkylbenzotriazoles, 2-mercaptobenimidazole, and more preferably benzotriazole and tert-butylcatechol. Such corrosion inhibitors are generally commercially available from a variety of sources, such as Aldrich (Milwaukee, Wis.) and may be used without further purification.

When such corrosion inhibitors are used in the compositions of the present invention, they are typically present in an amount in the range of from about 0.01 to about 10% wt, based on the total weight of the composition. It is preferred that the amount of corrosion inhibitor is from about 0.2 to about 5% wt, more preferably about 0.5 to about 3% wt, and most preferably from about 1.5 to about 2.5% wt.

The following examples are intended to illustrate further various aspects of the present invention, but are not intended to limit the scope of the invention in any aspect.

EXAMPLE 1

(Comparative)

Wafers containing post plasma etch residue were cleaned with a fluoride-based stripping composition containing dimethylacetamide, dipropylene glycol monomethyl ether, DI water, 2-methyl-1,3-propanediol, ammonium fluoride, corrosion inhibitor and surfactant. Following cleaning, the wafers were rinsed with isopropanol. A large amount of particle formation was observed in the isopropanol.

EXAMPLE 2

Rinsing solutions were prepared by combining the components listed in the Table.

| Sample | DI Water (% wt) | DPM (% wt) | PME (% wt) |
| --- | --- | --- | --- |
| 1 | 40 | 30 | 30 |
| 2 | 40 | 10 | 50 |

EXAMPLE 3

Wafers containing post plasma etch residue were cleaned with a fluoride-based stripping composition containing dimethylacetamide, dipropylene glycol monomethyl ether, DI water, 2-methyl-1,3-propanediol, ammonium fluoride, corrosion inhibitor and surfactant. Following cleaning, the wafers were rinsed with Sample 1. The drying time of the wafers was 1–2 minutes. No particle formation was observed in the rinse solution (Sample 1). SEM analysis showed that the wafer were cleaned of polymer.

EXAMPLE 4

The procedure of Example 3 was repeated except that the wafers were rinsed with Sample 2. The drying time of the wafers was <30 seconds. No particle formation was observed in the rinse solution (Sample 2). SEM analysis showed that the wafers were cleaned of polymer.

What is claimed is:

1. A method for manufacturing an electronic device comprising: a) containing polymeric material disposed on a substrate with a fluoride-based stripping composition for a period of time sufficient to at least partially remove the polymeric material; and b) then contacting the substrate with a rinsing composition including water and two or more solvents, wherein at least one solvent is selected from $(C_2-C_{20})$alkanediols, $(C_2-C_{20})$alkanetriols, $(C_1-C_6)$alkyl ethers of $(C_2-C_{20})$alkanediols, di$(C_1-C_6)$alkyl ethers of $(C_2-C_{20})$alkanediols, $(C_1-C_6)$alkyl ethers of $(C_2-C_{20})$ alkanetriols or di$(C_1-C_6)$alkyl ethers of $(C_2-C_{20})$ alkanetriols.

2. The method of claim 1 wherein the rinsing composition comprises at least one solvent selected from ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether or tripropylene glycol monomethyl ether.

3. The method of claim 1 wherein the rinsing composition comprises at least two solvents selected from ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether or tripropylene glycol monomethyl ether.

4. The method of claim 1 wherein the rinsing composition is substantially free of precipitate formation.

5. The method of claim 1 wherein at least one solvent is selected from include $C_1$–$C_6$ alkyl ethers of ($C_2$–$C_{20}$) alkanediols, di($C_1$–$C_6$)alkyl ethers of ($C_2$–$C_{20}$)alkanediols, ($C_1$–$C_6$)alkyl ethers of ($C_2$–$C_{20}$)alkanetriols or di($C_1$–$C_6$) alkyl ethers of ($C_2$–$C_{20}$)alkanetriols.

6. The method of claim 1 wherein the water is present in an amount of from about 25 to about 99% wt, based on the total weight of the composition.

7. The method of claim 1 wherein the water is >25% wt, based on the total weight of the composition.

8. The method of claim 1 wherein the rinsing composition further comprises one or more additives selected from corrosion inhibitors, wetting agents, chelating agents or co-solvents.

9. A method of removing polymeric material from a substrate comprising the steps of: a) contacting polymeric material disposed on a substrate with a fluoride-based stripping composition for a period of time sufficient to at least partially remove the polymeric material; and b) then contacting the substrate with a rinsing composition including water and two or more solvents, wherein at least one solvent is selected from ($C_2$–$C_{20}$)alkanediols, ($C_2$–$C_{20}$)alkanetriols, ($C_1$–$C_6$)alkyl ethers of ($C_2$–$C_{20}$)alkanediols, di($C_1$–$C_6$)alkyl ethers of ($C_2$–$C_{20}$)alkanediols, ($C_1$–$C_6$)alkyl ethers of ($C_2$–$C_{20}$)alkanetriols or di($C_1$–$C_6$)alkyl ethers of ($C_2$–$C_{20}$) alkanetriols.

10. The method of claim 9 wherein the rinsing composition further comprises one or more additives selected from corrosion inhibitors, wetting agents, chelating agents or co-solvents.

* * * * *